United States Patent [19]

Tamaki et al.

[11] Patent Number: 5,457,072
[45] Date of Patent: Oct. 10, 1995

[54] PROCESS FOR DICING A SEMICONDUCTOR WAFER HAVING A PLATED HEAT SINK USING A TEMPORARY SUBSTRATE

[75] Inventors: Masahiro Tamaki; Kouji Aono; Sinichi Sakamoto, all of Itami, Japan

[73] Assignee: Mitsubishi Denki Kabushiki Kaisha, Tokyo, Japan

[21] Appl. No.: 196,757

[22] Filed: Feb. 15, 1994

[30] Foreign Application Priority Data

Mar. 10, 1993 [JP] Japan ................................. 5-048868

[51] Int. Cl.⁶ .................................................. H01L 21/302
[52] U.S. Cl. .......................... 437/226; 437/902; 437/947
[58] Field of Search ................................. 437/902, 974, 437/226

[56] References Cited

U.S. PATENT DOCUMENTS

| | | | |
|---|---|---|---|
| 3,946,334 | 3/1976 | Yoneza et al. | 437/902 |
| 4,956,697 | 9/1990 | Kobiki et al. | 357/81 |
| 5,138,439 | 8/1992 | Kobiki | 357/80 |
| 5,200,641 | 4/1993 | Kosaki | 257/720 |
| 5,275,958 | 1/1994 | Ishikawa | 437/226 |
| 5,302,554 | 4/1994 | Kashiwa | 437/227 |
| 5,324,981 | 6/1994 | Kobiki et al. | 257/276 |

FOREIGN PATENT DOCUMENTS

55-71022  5/1980  Japan .
03232253  10/1991  Japan .

OTHER PUBLICATIONS

Okaniwa et al., "A Novel FET Structure of Buried Plated Heat Sink for Superior High Performance GaAs MMICs", IEEE GaAs IC Symposium, 1990, pp. 233-236.

*Primary Examiner*—Olik Chaudhuri
*Assistant Examiner*—David E. Graybill
*Attorney, Agent, or Firm*—Leydig, Voit & Mayer

[57] ABSTRACT

A method for producing semiconductor chips includes preparing a semiconductor wafer having opposite front and rear surfaces and active semiconductor devices disposed in the semiconductor wafer at a part of the front surface, attaching a glass plate to the front surface of the semiconductor wafer, thinning the semiconductor wafer to a desired thickness from the rear surface, forming a first radiating layer over the rear surface of the semiconductor wafer, selectively forming a second radiating layer on the first radiating layer using, as a mask, a photoresist pattern covering portions of the first radiating layer opposite dicing regions, removing the semiconductor wafer from the glass plate, and cutting through the wafer and the first radiating layer with a dicing blade to produce a plurality of semiconductor chips. In this method, since the first radiating layer supports the thin wafer, the glass plate can be removed before the dicing process. Therefore, electrical testing of the semiconductor devices included in the wafer can be carried out before the wafer is divided into chips.

6 Claims, 11 Drawing Sheets

Prior Art

PROCESS FOR DICING A SEMICONDUCTOR WAFER HAVING A PLATED HEAT SINK USING A TEMPORARY SUBSTRATE

FIELD OF THE INVENTION

The present invention relates to a semiconductor device and, more particularly, to a plated heat sink (hereinafter referred to as PHS) disposed on the rear surface of a semiconductor device, such as a GaAs field effect transistor (hereinafter referred to as FET). The invention also relates to methods for manufacturing the PHS.

BACKGROUND OF THE INVENTION

Generally, a conventional GaAs FET includes a semi-insulating GaAs substrate as thin as several tens of microns and a PHS disposed on the rear surface of the substrate to reduce the thermal resistance of the device.

Figure 14:
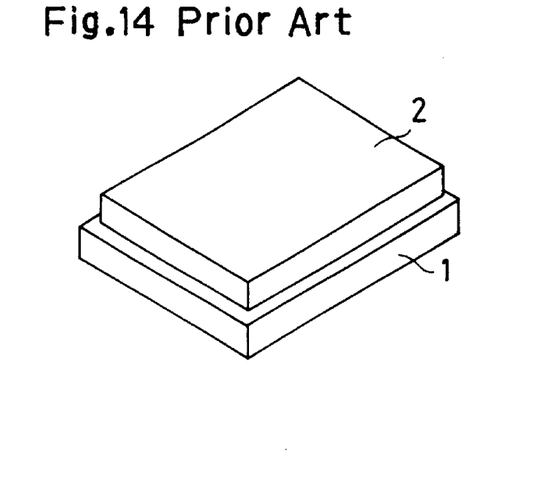
FIG. 14 is a perspective view illustrating a semiconductor chip in accordance with the prior art.

FIG. 14 is a perspective view illustrating a conventional semiconductor chip including a semiconductor substrate 2 about 35 μm thick and a PHS 1 about 35 μm thick.

Figure 15:
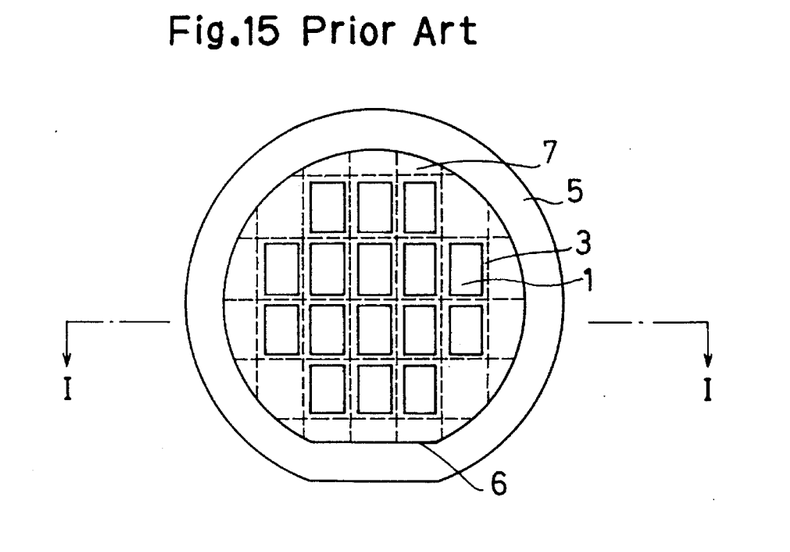
FIG. 15 is a bottom plan view illustrating a semiconductor wafer before it is divided into a plurality of semiconductor chips as in FIG. 14.
Figure 16:
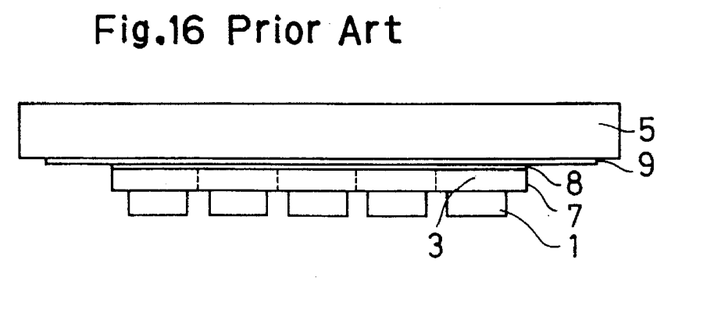
FIG. 16 is a sectional view taken along line I—I of FIG. 15.

FIG. 15 is a bottom plan view schematically illustrating a wafer before being divided into a plurality of semiconductor chips, and FIG. 16 is a sectional view taken along line I—I of FIG. 15. In these figures, reference numeral 7 designates a semiconductor wafer having opposite front and rear surfaces. A plurality of semiconductor devices, such as FETs, are disposed in a surface region of the wafer 7. A PHS 1 is disposed on the rear surface of the wafer 7 opposite each of the semiconductor devices 3. The diameter of the wafer 7 is about 3 inches and the thickness of the wafer 7 with the PHS 1 is about 35 μm. A photoresist film 8 is disposed on the front surface of the wafer 7 to protect the semiconductor devices. A glass plate 5 is attached to the photoresist film 8 via a wax 9. Reference numeral 6 designates an orientation flat, i.e., a reference line showing the crystal orientation of the wafer 7.

FIGS. 17(a) to 17(e) are sectional views illustrating process steps for producing the PHS 1 of FIG. 16.

Figure 17A:
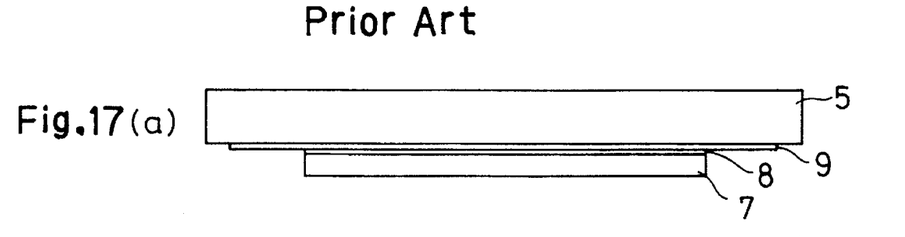
FIGS. 17(a)–17(e) are sectional views illustrating process steps of forming the semiconductor chip of FIG. 14.
Figure 17B:
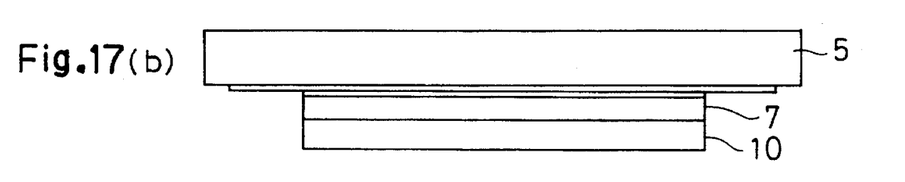
Figure 17C:
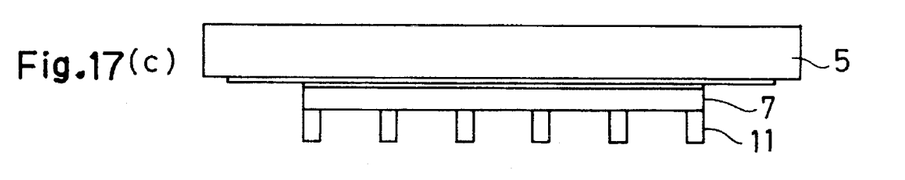
Figure 17D:
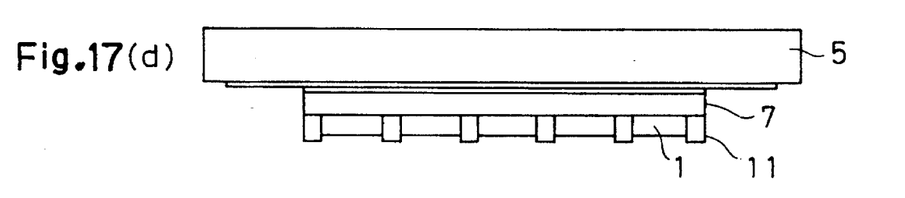
Figure 17E:
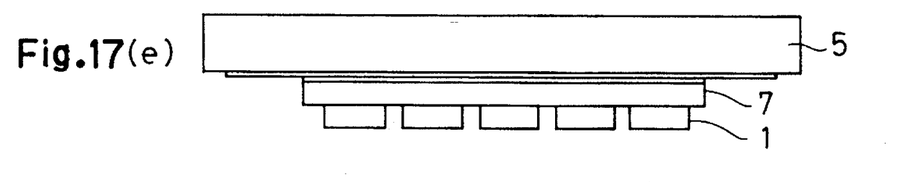

Initially, as illustrated in FIG. 17(a), the photoresist film 8 is deposited on the front surface of the wafer 7, and the wafer is adhered to the glass plate 5 using the wax 9. Then, a photoresist film 10, 40 μm, thick is deposited over the rear surface of the wafer 7 (FIG. 17(b)) and patterned by conventional photolithography (FIG. 17(c)). Using the photoresist pattern 11 as a mask, a metal, such as Au, is selectively deposited by electroplating (FIG. 17(d)), followed by removal of the photoresist pattern 11, forming a plurality of Au PHS layers (rear electrodes) 1 (FIG. 17(e)). Each of the PHS layers 1 is 35 μm thick and 1 mm×2~3 mm in size.

Figure 18:
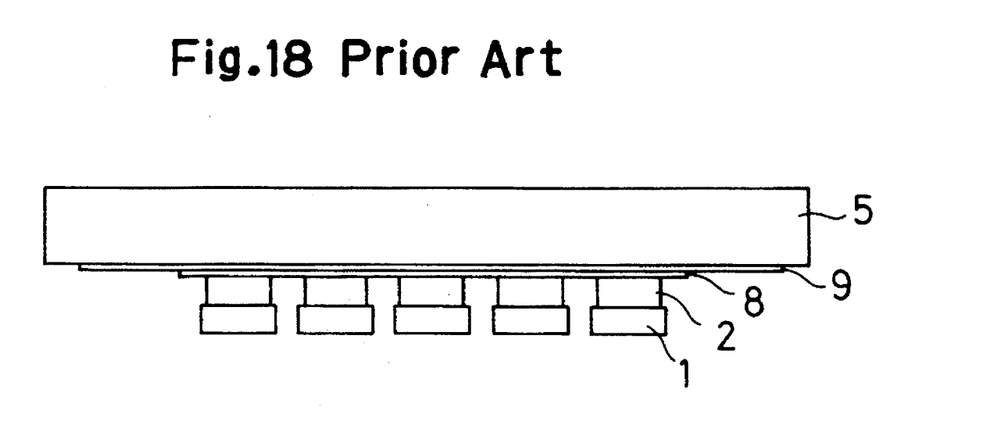
FIG. 18 is a sectional view illustrating a plurality of semiconductor chips before being separated from a glass plate.

FIG. 18 is a sectional view illustrating a process step of dividing the wafer 7 into a plurality of semiconductor chips. In FIG. 18, the wafer 7 is selectively etched by wet etching using the PHS layers 1 as a mask to divide the wafer 7 into a plurality of semiconductor chips 2. Thereafter, the photoresist film 8 and the wax 9 are melted and removed using chemicals, whereby the respective semiconductor chips 2 are separated from the glass plate 5, resulting in the semiconductor chip 2 with the PHS 1 shown in FIG. 14. Since the wet etching is isotropic, the semiconductor substrate 2 is smaller than the PHS 1.

In the conventional production process, since the semiconductor devices 3 are disposed in the surface region of the wafer 7 and the PHS layers 1 are disposed on the rear surface of the wafer 7 opposite the respective semiconductor devices, the electrical testing of the semiconductor devices have to be carried out after the formation of the PHS layers 1. However, since the wafer 7 is thinned to about 35 μm by polishing the rear surface thereof before the formation of the PHS layers 1 to improve the heat radiation, the glass plate 5 is used to support the thin wafer 7.

That is, the wafer 7 has to be attached to the glass plate 5 until the wet etching process for dividing the wafer into individual chips is finished and, therefore, the electrical testing of the semiconductor chips is carried out after separating the chips from the glass plate 5. Since each of the semiconductor chips is handled with tweezers, the electrical testing takes a lot of time and the semiconductor chip may be cracked due to the tweezers.

SUMMARY OF THE INVENTION

It is an object of the present invention to provide a semiconductor chip having a semiconductor device on its front surface and a PHS on its rear surface, which PHS enables the electrical testing of the semiconductor device to be performed before the chip is separated from a wafer.

It is another object of the present invention to provide a method for producing the semiconductor chip.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor chip includes a semiconductor substrate having opposite front and rear surfaces and an active semiconductor device disposed in the substrate at a part of the front surface, and a PHS disposed on the rear surface of the semiconductor substrate. The PHS comprises a first radiating layer disposed over the rear surface of the semiconductor substrate and a second radiating layer disposed on a part of the first radiating layer. In this structure, burrs of the first radiating layer caused by the dicing process not adversely affect the subsequent chip die-bonding process because the second radiating layer is thicker than the length of the burrs, resulting in a reliable junction between the semiconductor chip and a mounting substrate in the die-bonding process.

According to a second aspect of the present invention, portions of the first radiating layer where the second radiating layer is absent are covered with a material harder and thinner than the first radiating layer. Therefore, the burr of the first radiating layer is reduced.

According to a third aspect of the present invention, the first radiating layer is a two-layer structure comprising a metal film in contact with the rear surface of the semiconductor substrate and a film harder and thinner than the metal film. Therefore, burrs of the first radiating layer are reduced.

According to a fourth aspect of the present invention, in a method for producing semiconductor chips, initially, a semiconductor wafer having opposite front and rear surfaces and active semiconductor devices disposed in the semiconductor substrate at a part of the front surface is prepared. A glass plate is attached to the front surface of the semiconductor wafer, and the semiconductor wafer is thinned to a desired thickness from the rear surface. Then, a first radiating layer is formed over the rear surface of the semiconductor wafer, and a second radiating layer is selectively formed on the first radiating layer using, as a mask, a photoresist pattern covering portions of the first radiating layer opposite dicing regions. After removing the semiconductor wafer from the glass plate and rinsing the front surface of the wafer, the wafer and the first radiating layer are cut through with a dicing blade to produce a plurality of semiconductor chips. In this method, since the first radiating layer supports the thin wafer, the glass plate can be removed before the dicer cutting process. Therefore, the electrical testing of the semiconductor devices included in the wafer can be carried out before the wafer is divided into chips, significantly reducing the time required for the electrical testing.

BRIEF DESCRIPTION OF THE DRAWINGS

FIGS. 5(a)–5(i) are sectional views illustrating process steps of forming the PHS of the semiconductor chip of FIG. 1;

FIGS. 9(a)–9(l) are sectional views illustrating process steps of forming the PHS of the semiconductor chip of FIG. 6;

DETAILED DESCRIPTION OF THE PREFERRED EMBODIMENTS

Figure 1:
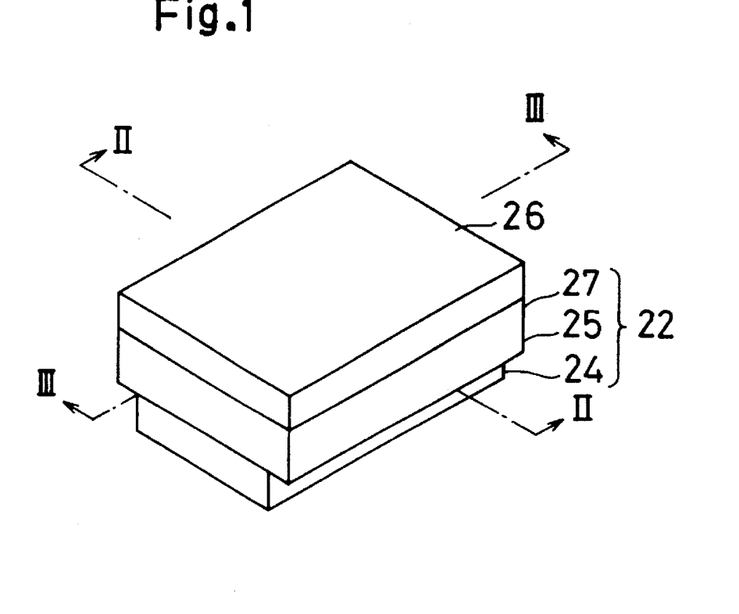
FIG. 1 is a perspective view illustrating a semiconductor chip in accordance with a first embodiment of the present invention.
Figure 2:
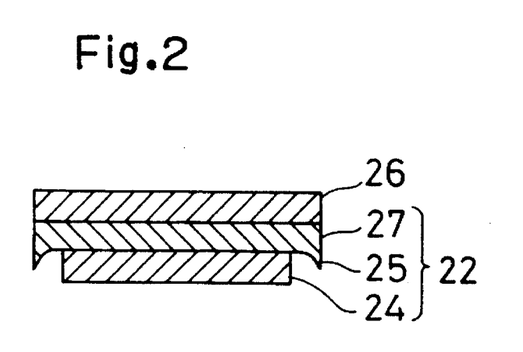
FIG. 2 is a sectional view taken along line II—II of FIG. 1.
Figure 3:
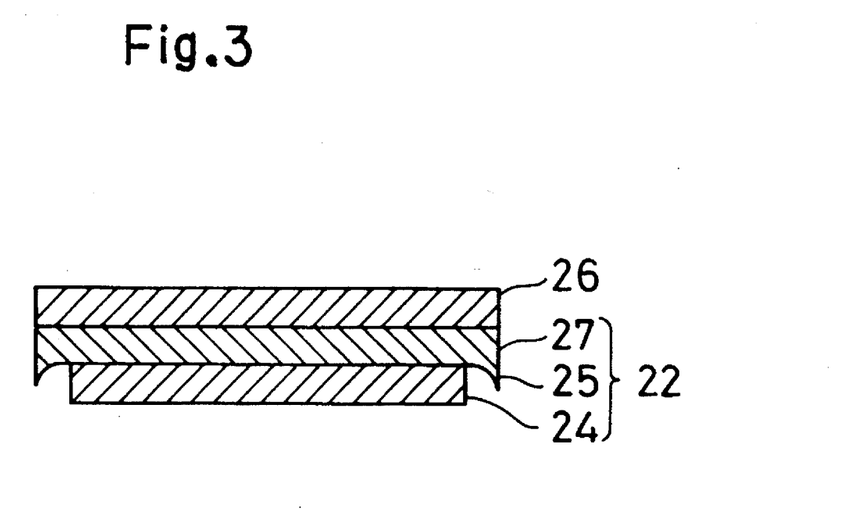
FIG. 3 is a sectional view taken along line III—III of FIG. 1.

FIG. 1 is a perspective view illustrating a semiconductor chip in accordance with a first embodiment of the present invention, FIG. 2 is a sectional view taken along line II—II of FIG. 1, and FIG. 3 is a sectional view taken along line III—III of FIG. 1. In these figures, reference numeral 26 designates a semiconductor substrate about 35 μm thick having opposite front and rear surfaces. A PHS 22 comprises a first metal film 27 and a second metal film 24. The first metal film 27 is in contact with the rear surface of the substrate 26 and the second metal film 24 is disposed on a part of the first metal film 27. Preferably, the first metal film 27 comprises Au about 20 μm thick. Other metals, such as Ag, Cu, or Al, may be employed so long as they are thermally and electrically conductive. Preferably, the second metal film 24 comprises Au about 40–50 μm thick. Other metals, such as Ag or Cu, may be employed. Reference numeral 25 designates a burr produced during dicing the first metal film 27.

Figure 4:
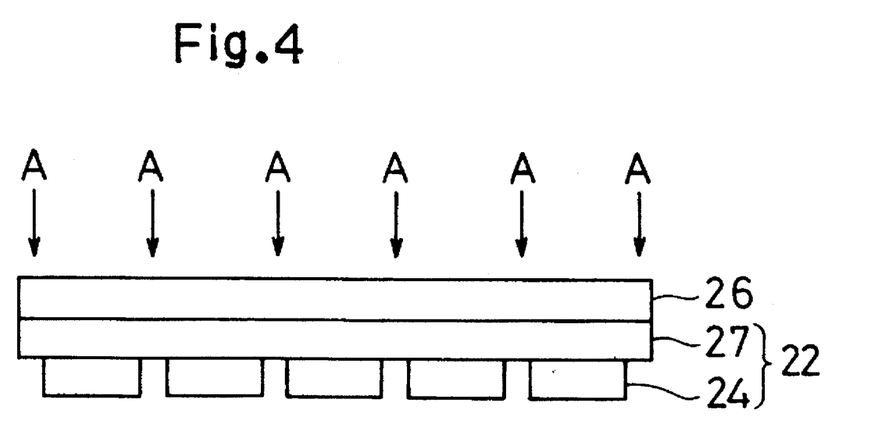
FIG. 4 is a sectional view illustrating a semiconductor wafer before it is divided into a plurality of semiconductor chips as in FIG. 1.

FIG. 4 is a sectional view illustrating the semiconductor wafer 26 with the PHS 22 before it is divided into semiconductor chips. In FIG. 4, the first metal film 27 is disposed over the rear surface of the semiconductor wafer 26. In the state of FIG. 4, if the wafer 26 and the first metal film 27 are cut through at positions indicated by arrows A using a dicing blade, burrs 25 of the first metal film 27 are produced as shown in FIG. 2.

FIGS. 5(a)–5(i) are sectional views illustrating process steps of forming the semiconductor chip of FIG. 1.

Figure 5A:
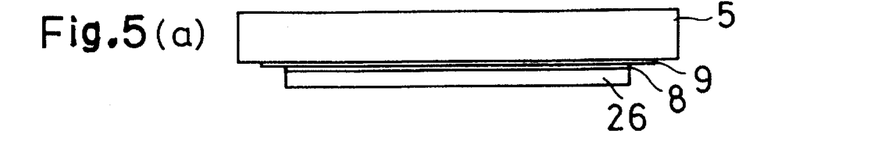

In FIG. 5(a), the semiconductor wafer 26 about 35 μm thick, the front surface of which is covered with the photoresist film 8, is attached to the glass plate 5 using the wax 9.

Figure 5B:
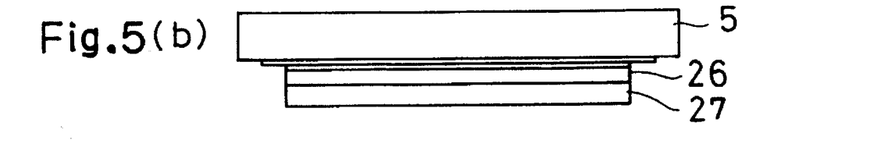
Figure 5C:
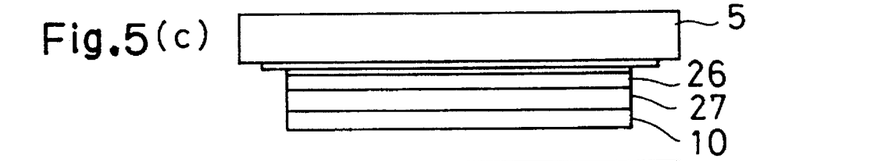

Then, the first metal film 27 is deposited on the rear surface of the wafer to a thickness of about 20 μm (FIG. 5(b)), and a photoresist film 10 is deposited on the first metal film 27 to a thickness of 40–50 μm (FIG. 5(c)). The thickness of the photoresist film 10 depends on the length of the burr of the first metal film 27.

Figure 5D:
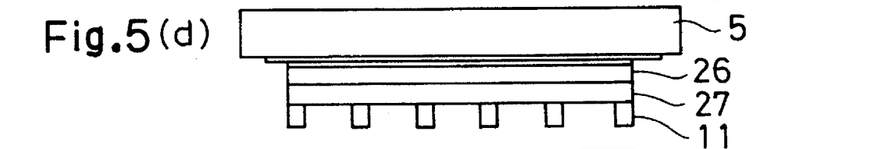
Figure 5E:
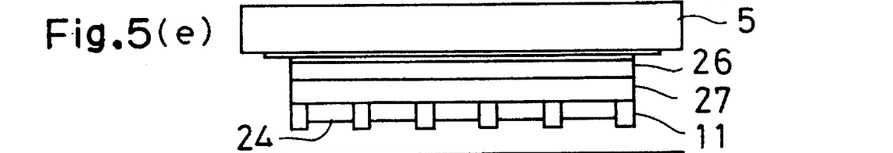

After patterning the photoresist film 10 by conventional photolithography (FIG. 5(d)), the second metal film 24 is selectively deposited to a thickness of 40– 50 μm using the photoresist pattern 11 as a mask (FIG. 5(e)). Thereafter, the photoresist pattern 11 is removed (FIG. 5(f)).

In the conventional process steps described with respect to FIGS. 17(a)–17(e), since the glass plate 5 is attached to the front surface of the wafer 7 where the semiconductor devices, such as FETs, are present until the wafer 7 is divided into chips, it is impossible to carry out electrical testing of the semiconductor devices included in the wafer and, therefore, each of the semiconductor devices is individually tested after dividing the wafer into chips.

In this first embodiment of the present invention, however, the first metal film 27 is interposed between the semiconductor wafer 26 and the second metal film 24 which corresponds to the conventional PHS 1. That is, the wafer 26 is supported by the thick first metal film 27 disposed over the rear surface of the wafer 26. The reason why the second metal film 24 which corresponds to the conventional PHS 1 is necessary will be described hereinafter using FIGS. 5(g)–5(i).

Figure 5H:
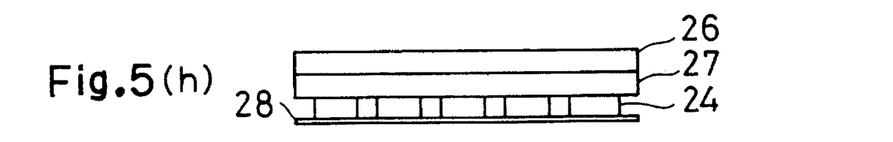
Figure 5I:
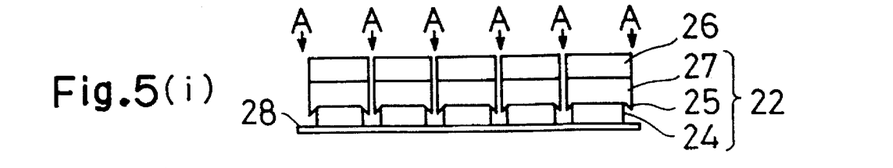

In the step of FIG. 5(g), the glass plate 5 is removed, and the wax 9 and the photoresist film 8 are washed away using chemicals. Then, the electrical testing of the circuits, such as FETs, of the semiconductor devices included in the wafer 26 is carried out. Then, an expandable adhesive sheet 28 is attached to the second metal film 24 (FIG. 5(*h*)), and the wafer 26 and the first metal film 27 are cut through at positions indicated by arrows A (dicing regions) using a dicing blade (FIG. 5(*i*)). Thereafter, good quality semiconductor chips are selected according to the result of the electrical testing. The selected semiconductor chips are used in the assembly process.

During the dicing process, the burr 25 is produced due to the friction between the dicing blade and the first metal film 27. If the burr 25 is long and protrudes over the rear surface of the PHS 22, the semiconductor chip is unfavorably inclined when it is die-bonded on a mount substrate in the assembly process. That is, the first metal film 27 alone is insufficient for the PHS and, therefore, the second metal film 24 that extends beyond the burr 25 is disposed on the rear surface of the first metal film 27.

According to the first embodiment of the present invention, the PHS 22 comprises the first metal film 27 and the second metal film 24. Since the first metal film 27 supports the thin semiconductor wafer 26, the glass plate 5 can be removed from the wafer 26 before the wafer dicing process. Therefore, it is possible to conduct the electrical testing of the semiconductor devices included in the wafer, significantly reducing the time required for the test. In addition, the burr 25 of the first metal film 27 does not adversely affect the subsequent die-bonding process because the second metal film 24 is thicker than the length of the burr 25, resulting in a reliable junction between the semiconductor chip and a mount substrate in the die-bonding process. This first embodiment is effective especially when the first metal 27 comprises a ductile metal, such as Au.

Figure 6:
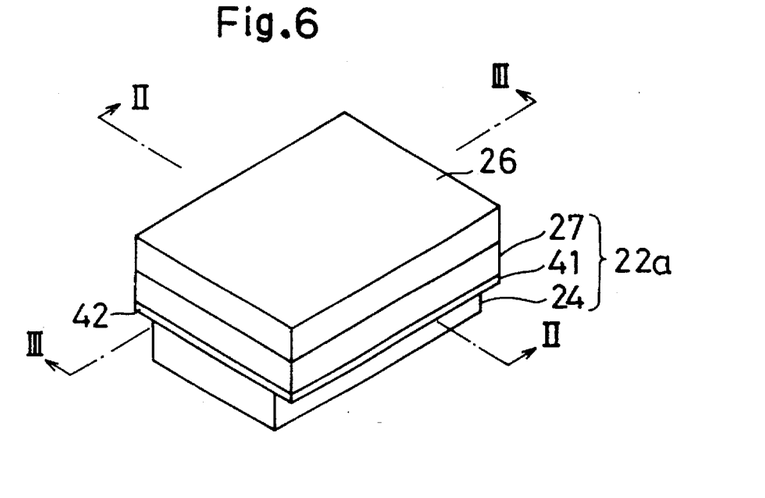
FIG. 6 is a perspective view illustrating a semiconductor chip in accordance with a second embodiment of the present invention.
Figure 7:
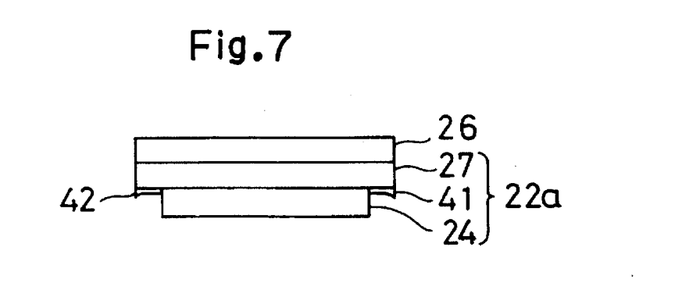
FIG. 7 is a sectional view taken along line II—II of FIG. 6.
Figure 8:
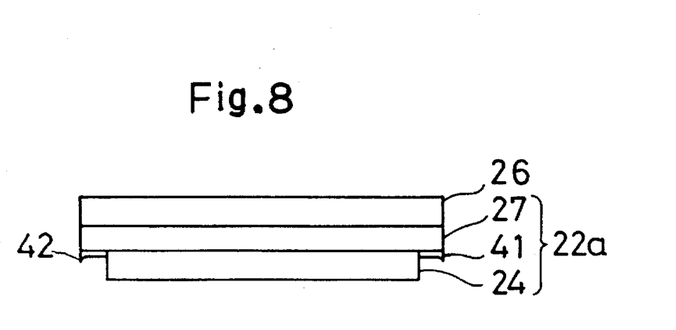
FIG. 8 is a sectional view taken along line III—III of FIG. 6.
Figure 9A:
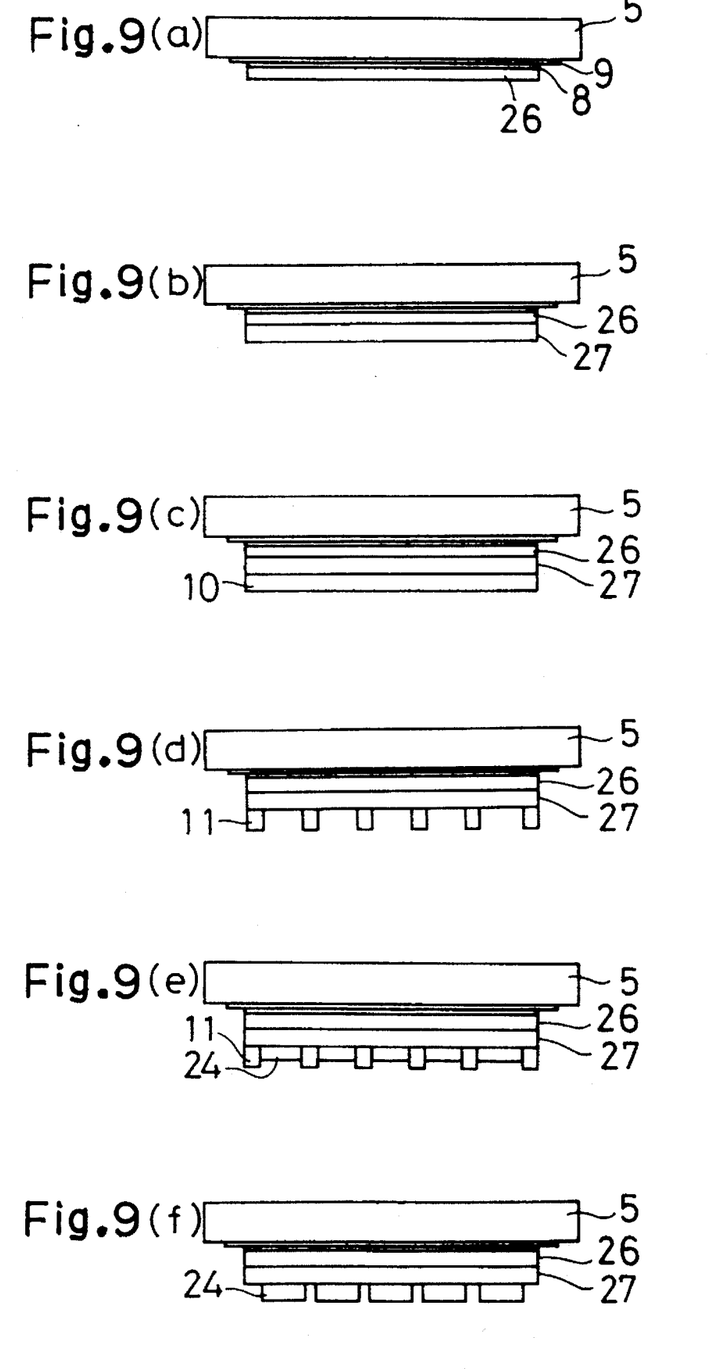
Figure 9G:
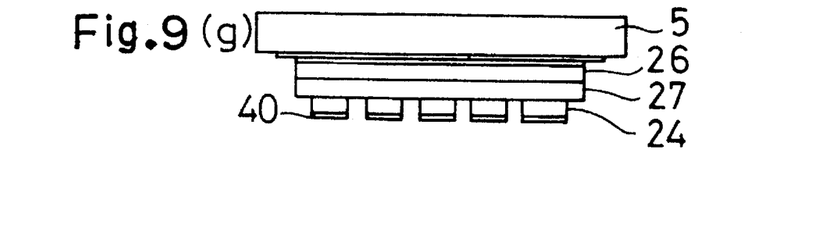
Figure 9H:
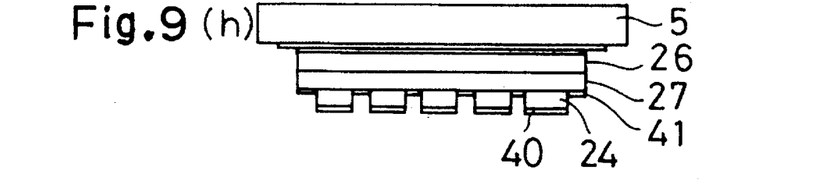
Figure 9I:
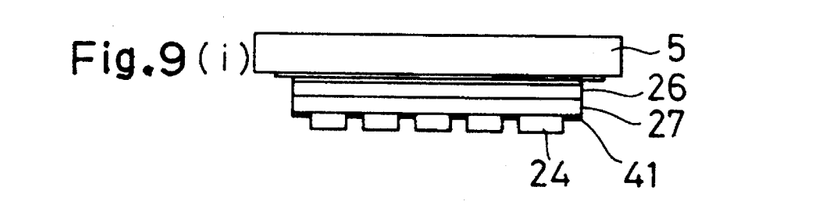
Figure 9J:
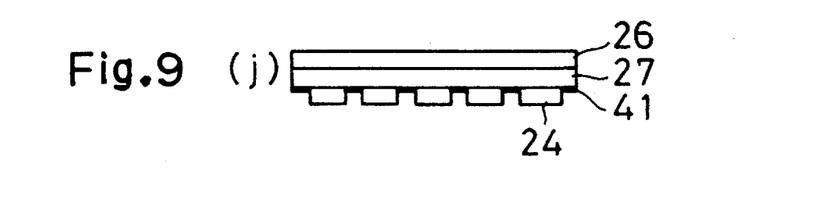
Figure 9K:
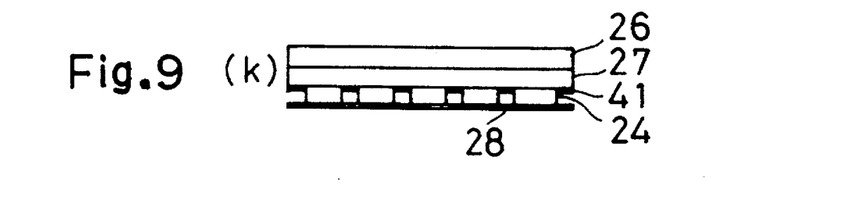
Figure 9L:
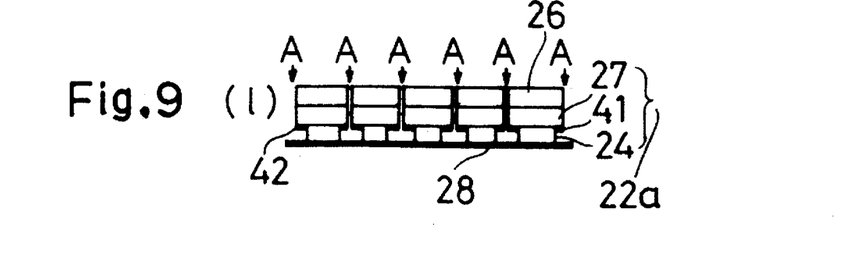

FIG. 6 is a perspective view illustrating a semiconductor chip in accordance with the second embodiment of the present invention. FIGS. 7 and 8 are sectional views taken along lines II—II and III—III of FIG. 6, respectively. In this second embodiment, portions of the rear surface of the first metal film 27 where the second metal film 24 is absent are covered with a third metal film 41 which is harder and thinner than the first metal film 27. The first metal film 27 is about 20 μm thick and the second metal film 24 is 15~20 μm thick. Preferably, the first and second metal films 27 and 24 comprise Au. The third metal film 41 is about 1~10 μm thick and comprises a non-ductile metal, such as Cr or Fe. Reference numeral 42 designates a burr of the third metal film 41 caused by the dicer cutting.

FIGS. 9(*a*)–9(*l*) are sectional views illustrating process steps for producing semiconductor chips in accordance with the second embodiment of the present invention. The steps of FIGS. 9(*a*)–9(*f*) are identical to those already described with respect to FIGS. 5(*a*)–5(*f*) and, therefore, do not require repeated description.

In FIG. 9(*g*), a photoresist 40 is deposited and patterned on the rear surfaces of the second metal films 24 by conventional photolithography. Using the photoresist pattern 40 as a mask, the third metal film 41 is deposited on the exposed portions of the first metal film 27 by deposition and lift-off techniques or electroplating (FIG. 9(*h*)). Thereafter, the photoresist pattern 40 is removed (FIG. 9(*i*)). The subsequent process steps shown in FIGS. 9(*j*)–9(*l*) are identical to those already described with respect to FIGS. 5(*g*)–5(*i*) except that the third metal film 41 is partially present on the rear surface of the first metal film 27.

According to the second embodiment of the present invention, since the first metal film 27 supports the semiconductor wafer 26, the glass plate 5 can be removed from the wafer 26 before the wafer dicing process. Therefore, electrical testing of the semiconductor devices included in the wafer 26 is possible, significantly reducing the time required for the electrical test. Further, the third metal film 41, i.e., the non-ductile metal film, partially disposed on the rear surface of the first metal film 27 opposite the dicing regions reduces the length of the burr of the first metal film 27. Since the burr 42 of the third metal film 41 itself is small, the thickness of the second metal film 24 can be reduced to 15~20 μm. Accordingly, the material of the second metal film 24 can be reduced, resulting in a significant reduction of the production cost, especially when an expensive material, such as Au, is used for the second metal film 24.

Figure 10:
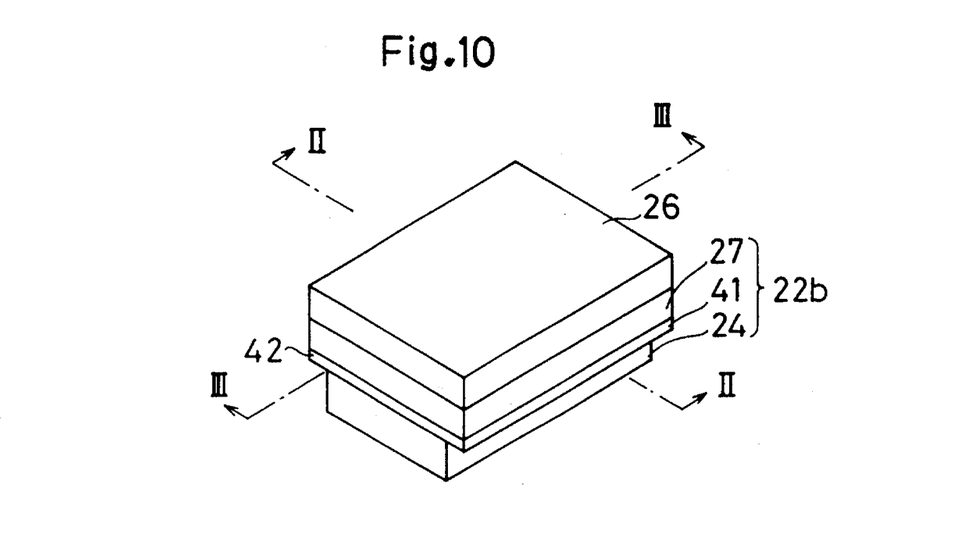
FIG. 10 is a perspective view illustrating a semiconductor chip in accordance with a third embodiment of the present invention.
Figure 11:
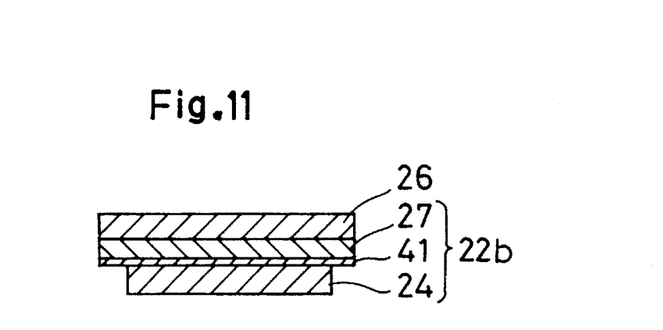
FIG. 11 is a sectional view taken along line II—II of FIG. 10.
Figure 12:
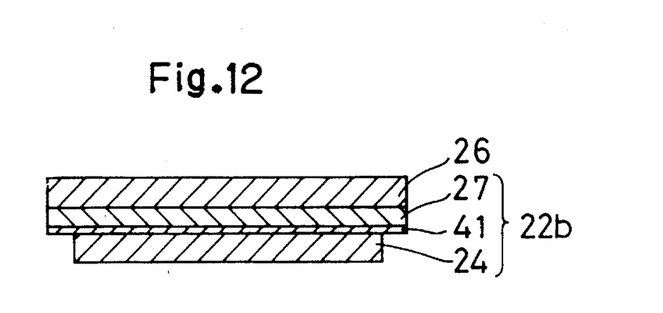
FIG. 12 is a sectional view taken along line III—III of FIG. 10.
Figure 13A:
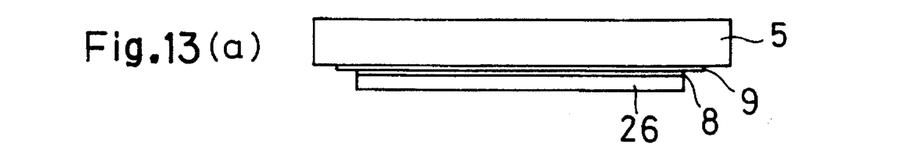
FIGS. 13(a)–13(i) are sectional views illustrating process steps of forming the semiconductor chip of FIG. 10.
Figure 13B:
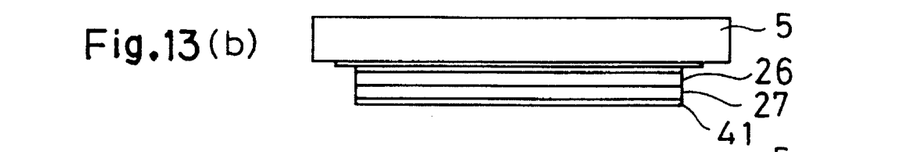
Figure 13C:
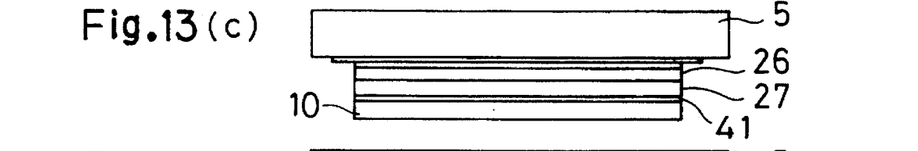
Figure 13D:
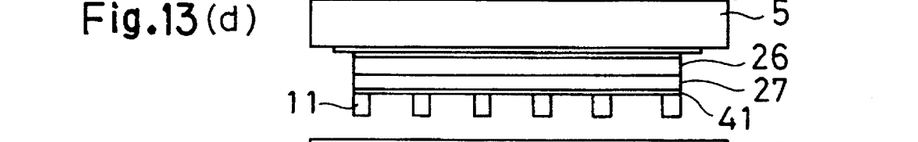
Figure 13E:
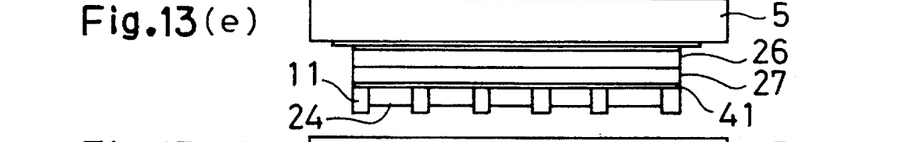
Figure 13F:
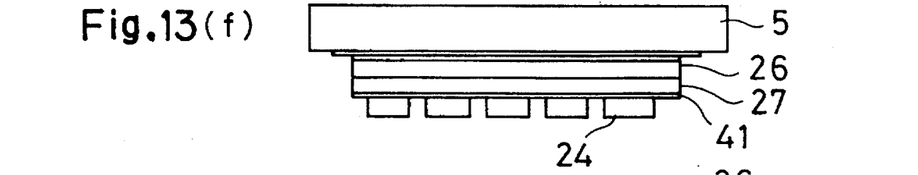
Figure 13G:
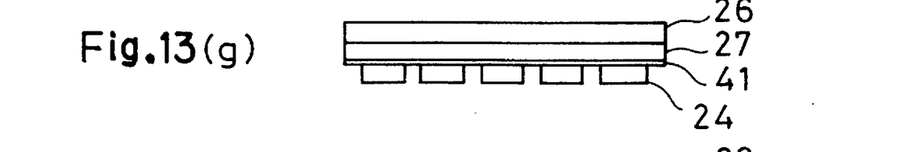
Figure 13H:
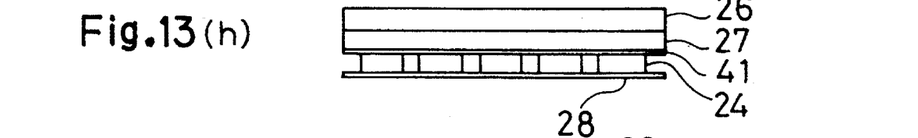
Figure 13I:
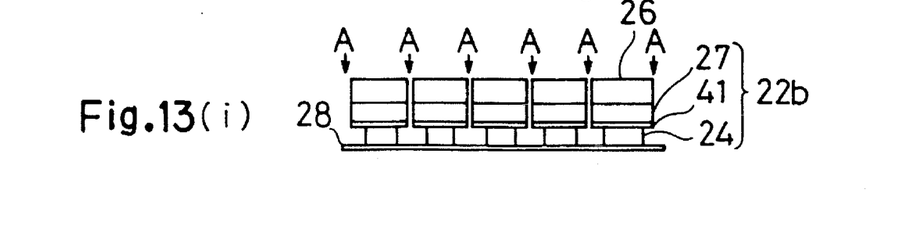

FIG. 10 is a perspective view illustrating a semiconductor chip in accordance with a third embodiment of the present invention. FIGS. 11 and 12 are sectional views taken along lines II—II and III—III of FIG. 10, respectively. In this third embodiment, the third metal film 41 is interposed between the first metal film 27 and the second metal film 24. Preferably, the first and second metal films 27 and 24 comprise Au about 10 μm thick, and the third metal film 41 comprises a metal harder than Au, for example, Cr or Fe. Reference numeral 42 designates a burr of the third metal film 41 caused by the dicer cutting.

FIGS. 13(*a*)–13(*i*) are sectional views illustrating process steps for producing semiconductor chips in accordance with the third embodiment of the present invention.

After attaching the glass plate 5 to the front surface of the semiconductor wafer 26 as shown in FIG. 13(*a*), the first metal film 27 is formed on the rear surface of the wafer 26 and the third metal film 41 is formed on the first metal film 27 (FIG. 13(*b*)). Preferably, the third metal film 41 is formed by electroplating. The subsequent steps of FIGS. 13(*c*)–13(*i*) are fundamentally identical to the steps already described with respect to FIGS. 5(*c*)–5(*i*) except that the third metal film 41 is present on the first metal film 27.

According to the third embodiment of the present invention, since the non-ductile third metal film 41 is disposed over the rear surface of the ductile metal film 27, the burr of the ductile metal film 27 due to the dicer cutting is reduced, with the result that the thickness of the second metal film 24 is reduced.

In the above-described second embodiment, the material of the non-ductile film 41 is not restricted to metals. Other materials, such as an insulating material, may be employed so long as it reduces the burr of the first metal film 27 due to the dicer cutting.

The structure of the PHS of the present invention is not restricted to the two-layer structure according to the first embodiment nor to the three-layer structure according to the third embodiment. The PHS may comprise more layers so long as a non-ductile film is present at the lowermost part of the PHS opposite the dicing regions.

What is claimed is:

1. A method for producing semiconductor chips comprising:

preparing a semiconductor wafer having opposite front and rear surfaces and active semiconductor devices disposed in said semiconductor wafer at portions of the front surface;

attaching a glass plate to the front surface of said semiconductor wafer and grinding said semiconductor wafer from the rear surface to a given thickness;

forming a first radiating layer on the rear surface of said semiconductor wafer;

forming a film harder and thinner than said first radiating layer on said first radiating layer;

forming a second radiating layer on said harder and thinner film using a photoresist pattern masking portions of said harder and thinner film opposite dicing regions of said semiconductor wafer;

removing said semiconductor wafer from said glass plate and rinsing the front surface of said semiconductor wafer; and cutting through said semiconductor wafer, said first radiating layer, and said harder and thinner film with a dicing blade at the dicing regions to produce a plurality of semiconductor chips.

2. The method of claim 1 wherein said first radiating layer comprises Au and said film harder and thinner than said first radiating layer comprises one of Cr and Fe.

3. The method of claim 2 including forming said film harder and thinner than said first radiating layer by electroplating.

4. A method for producing semiconductor chips comprising:

preparing a semiconductor wafer having opposite front and rear surfaces and active semiconductor devices disposed in said semiconductor wafer at portions of the front surface;

attaching a glass plate to the front surface of said semiconductor wafer and grinding said semiconductor wafer from the rear surface to a given thickness;

forming a first radiating layer on the rear surface of said semiconductor wafer;

forming a second radiating layer on the first radiating layer using a photoresist pattern masking portions of the first radiating layer opposite dicing regions of said semiconductor wafer;

forming a film harder and thinner than said first radiating layer on portions of said first radiating layer, which portions are exposed by removing said photoresist pattern;

removing said semiconductor wafer from said glass plate and rinsing the front surface of said semiconductor wafer; and cutting through said semiconductor wafer, said first radiating layer, and said harder and thinner film with a dicing blade at the dicing regions to produce a plurality of semiconductor chips.

5. The method of claim 4 wherein said first radiating layer comprises Au and said film harder and thinner than said first radiating layer comprises one of Cr and Fe.

6. The method of claim 4 including forming said film harder and thinner than said first radiating layer by deposition and lift-off techniques or electroplating.

* * * * *